(12) United States Patent
Bae et al.

(10) Patent No.: US 7,948,164 B2
(45) Date of Patent: May 24, 2011

(54) ORGANIC ELECTRO LUMINESCENCE DEVICE AND FABRICATION METHOD THEREOF

(75) Inventors: Sung Joon Bae, Seongnam-si (KR); Jae Yong Park, Anyang-si (KR); Ock Hee Kim, Anyang-si (KR); Kwan Soo Kim, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 885 days.

(21) Appl. No.: 11/170,073

(22) Filed: Jun. 30, 2005

(65) Prior Publication Data
US 2006/0055313 A1    Mar. 16, 2006

(30) Foreign Application Priority Data

Sep. 16, 2004  (KR) ................. 10-2004-0074059

(51) Int. Cl.
*H05B 33/08* (2006.01)
*H05B 33/00* (2006.01)
*H05B 33/10* (2006.01)

(52) U.S. Cl. ........ 313/504; 313/500; 313/503; 313/505; 313/506

(58) Field of Classification Search .......... 313/495–512; 315/169.3, 169.4; 257/40, 79; 428/690, 428/917; 345/30, 36, 44, 45; 445/24, 25
See application file for complete search history.

(56) References Cited

U.S. PATENT DOCUMENTS

| | | | | |
|---|---|---|---|---|
| 5,294,869 | A * | 3/1994 | Tang et al. | 313/504 |
| 6,380,687 | B1 * | 4/2002 | Yamazaki | 315/169.3 |
| 2002/0195961 | A1 | 12/2002 | Barth et al. | |
| 2004/0069986 | A1 * | 4/2004 | Park et al. | 257/40 |
| 2004/0100191 | A1 * | 5/2004 | Park | 313/506 |
| 2004/0227459 | A1 * | 11/2004 | Imura | 313/504 |

FOREIGN PATENT DOCUMENTS

| | | |
|---|---|---|
| GB | 2 396 245 | 6/2004 |
| KR | 1020030079429 | 10/2003 |
| KR | 1020030086167 | 11/2003 |

OTHER PUBLICATIONS

Communication from Korean Patant Office dated Apr. 24, 2006.

* cited by examiner

*Primary Examiner* — Bumsuk Won
*Assistant Examiner* — Elmito Breval
(74) *Attorney, Agent, or Firm* — McKenna Long & Alrdridge LLP

(57) ABSTRACT

An organic electro luminescence device includes: a display region and a non-display region defined in first and second substrates, sub-pixels defined in the display region; an array element including at least one TFT in the display region of the first substrate in each sub-pixel; a first electrode in an inner surface of the second substrate; a buffer in a predetermined region to partition an emission region of each sub-pixel on the first electrode, and an electrode separator on the buffer; an insulating layer in the emission region of each sub-pixel, and a spacer formed on the insulating layer; an organic electro luminescent layer in the emission region of each sub-pixel, the emission region including the insulating layer and the spacer; and a second electrode on the second substrate where the organic electro luminescent layer is formed.

8 Claims, 5 Drawing Sheets

ORGANIC ELECTRO LUMINESCENCE DEVICE AND FABRICATION METHOD THEREOF

This application claims the benefit of Korean Patent Application No. P2004-74059 filed on Sep. 16, 2004, which is hereby incorporated by reference for all purposes as if fully set forth herein.

BACKGROUND OF THE INVENTION

1. Field of the Invention

The present invention relates to an organic electro luminescence device, and more particularly, to a dual panel type organic electro luminescence device and a fabrication method thereof.

2. Description of the Related Art

One of new flat panel display devices is an organic electro luminescence device. Because the organic electro luminescence device is a self-luminous display device, it has a high contrast and wide viewing angle compared to the liquid crystal display (LCD). Also, since the organic electro luminescence device does not require a backlight assembly, it is lightweight and slim. In addition, the organic electro luminescence device can decrease power consumption.

Further, the organic electro luminescence device can be driven at a low DC voltage and has a rapid response time. All the components of the organic electro luminescence device are formed of solid materials; thus, the device is endurable against external impact, can be used in a wide range of temperatures range, and can be manufactured at a low cost.

Specifically, the organic electro luminescence device is easily fabricated through a deposition process and an encapsulation process. Therefore, the fabrication method and apparatus of the organic electro luminescence device is simpler than those of an LCD or plasma display device (PDP).

Such a related art organic electro luminescence device is driven in a passive matrix mode that does not require separate switching elements.

In the passive matrix mode, scan lines and signal lines are crossed with one another and elements are arranged in a matrix. In order to drive pixels, the scan lines are sequentially driven according to time. Therefore, in order to produce a necessary mean brightness, the passive matrix organic electro luminescence device must provide instantaneous brightness corresponding to a product of a mean brightness and the number of lines.

In an active matrix mode, however, a thin film transistor (TFT), serving as a switching element to turn on/off pixel, is disposed in each sub-pixel. A first electrode connected to the TFT is switched on/off based on the sub-pixel, and a second electrode facing the first electrode is a common electrode.

In the active matrix, since a voltage applied to the pixel is charged in a storage capacitor ($C_{ST}$), a voltage must be applied until a next frame signal is input. Therefore, the organic electro luminescence device must be continuously driven during one picture regardless of the number of scan lines.

If the organic electro luminescence device is driven in an active matrix mode, uniform brightness can be obtained even when a low current is applied. Accordingly, the active matrix organic electro luminescence device has advantages of low power consumption, high definition, and large-sized screen.

FIG. 1 is a schematic sectional view of a related art bottom emission type organic electro luminescence device. In FIG. 1, only one pixel region including red, green and blue sub-pixels is illustrated for conciseness.

Referring to FIG. 1, first and second substrates 10 and 30 are arranged to face each other. Edge portions of the first and second substrates 10 and 30 are encapsulated by a seal pattern 40. A TFT T is formed on a transparent substrate 1 of the first substrate 10 in sub-pixel unit. A first electrode 12 is connected to the TFT T. An organic electro luminescent layer 14 is formed on the TFT T and the first electrode 12 and is arranged to correspond to the first electrode 12. The organic electro luminescent layer 14 contains light emission materials taking on red, green and blue colors. A second electrode 16 is formed on the organic electro luminescent layer 14.

The first and second electrodes 12 and 16 function to apply an electric field to the organic electro luminescent layer 14.

Due to the seal pattern 40, the second electrode 16 and the second substrate 30 are spaced apart from each other by a predetermined distance. Therefore, an absorbent (not shown) and a translucent tape (not shown) may be further provided in an inner surface of the second substrate 30. The absorbent absorbs moisture introduced from an exterior, and the translucent tape adheres the absorbent to the second substrate 30.

In the bottom emission type structure, when the first electrode 12 and the second electrode 16 are an anode and a cathode, respectively, the first electrode 12 is formed of a transparent conductive material and the second electrode 16 is formed of a metal having a low work function. In such a condition, the organic electro luminescent layer 14 includes a hole injection layer 14a, a hole transporting layer 14b, an emission layer 14c, and an electron transporting layer 14d, which are sequentially formed on a layer contacting with the first electrode 12.

The emission layer 14c has red, green and blue color filters for sub-pixels.

FIG. 2 is an enlarged sectional view of one sub-pixel region in the bottom emission type organic electro luminescence device shown in FIG. 1.

Referring to FIG. 2, a semiconductor layer 68, a gate electrode 62, and source and drain electrodes 80 and 82 are sequentially formed on a transparent substrate 1, thereby forming a TFT region. A power electrode 72 extending from a power line (not shown) is connected to the source electrode 80 and an organic electro luminescent diode E is connected to the drain electrode 82.

A capacitor electrode 64 is disposed at a lower portion with reference to the power electrode 72. The capacitor electrode 64 is formed of a same material as the semiconductor layer 68. A dielectric layer is interposed between the semiconductor layer 68 and the capacitor electrode 64. A region corresponding to them is a storage capacitor region.

Except the organic electro luminescent diode E, the elements formed in the TFT region and the storage capacitor region is an array elements A.

The organic electro luminescent diode E includes a first electrode 12, a second electrode 16, and an organic electrode luminescent layer 14 interposed between the first and second electrodes 12 and 16. The organic electro luminescent diode E is disposed in an emission region from which a self-luminous light is emitted.

In the related art organic electro luminescence device, the array element (A) and the organic electro luminescent diode (E) are stacked on the same substrate.

The bottom emission type organic electro luminescence device is fabricated by attaching the substrate, where the array element and the organic electro luminescent diode are formed, to the separate substrate provided for the encapsulation.

In this case, the yield of the organic electro luminescence device is determined by the product of the yield of the array element and the yield of the organic electro luminescent diode. Therefore, the entire process yield is greatly restricted by the process of forming the organic electro luminescent diode. For example, even though excellent array elements are formed, if foreign particles or other factors cause defects in forming the organic electro luminescent layer of a thin film of about 1000 Å thick, the corresponding organic electro luminescence device is defective.

Thus, there are loss of expense and material costs that are spent in fabricating the non-defective array element, resulting in the reduction of the yield.

In addition, the bottom emission type organic electro luminescence device has high stability and a high degree of freedom due to the encapsulation, but has limitation in aperture ratio. Thus, the bottom emission type organic electro luminescence device is difficult to apply to high-definition products. Meanwhile, in the case of the top emission type organic electro luminescence device, the design of the TFTs is easy and the aperture ratio is high. Thus, it is advantageous in view of the lifetime of the product. However, since the cathode is disposed on the organic electro luminescent layer, the selection of material is restricted. Consequently, the transmittance is limited and the luminous efficiency is degraded.

SUMMARY OF THE INVENTION

Accordingly, the present invention is directed to an organic electro luminescence device and a fabrication method thereof that substantially obviate one or more problems due to limitations and disadvantages of the related art.

An advantage of the present invention is to provide an organic electro luminescence device and a fabrication method thereof, capable of improving an aperture ratio and resolution. In the organic electro luminescence device, an array element and an organic electro luminescent diode are formed on different substrates. The organic electro luminescent diode having the organic electro luminescent layer is formed on a second substrate, and a TFT for driving the organic electro luminescent diode is formed on a first substrate. A conductive spacer is formed on the second substrate to electrically connect the TFT and the organic electro luminescent diode.

Additional advantages and features of the invention will be set forth in part in the description which follows and in part will become apparent to those having ordinary skill in the art upon examination of the following or may be learned from practice of the invention. These and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic electro luminescence device, including: a display region and a non-display region defined in first and second substrates, and sub-pixels defined in the display region; an array element including at least one TFT in the display region of the first substrate in each sub-pixel; a first electrode in an inner surface of the second substrate; a buffer in a predetermined region to partition an emission region of each sub-pixel on the first electrode, and an electrode separator on the buffer; an insulating layer in the emission region of each sub-pixel, and a spacer on the insulating layer; an organic electro luminescent layer in the emission region of each sub-pixel, the emission region including the insulating layer and the spacer; and a second electrode on the second substrate where the organic electro luminescent layer is formed.

In another aspect of the present invention, there is provided a fabrication method of an organic electro luminescence device, the fabrication method including: forming an array element including at least one TFT in a display region of a first substrate in each sub-pixel; forming a first electrode in a display region of a second substrate; forming a buffer to partition an emission region of each sub-pixel on the first electrode, and an insulating layer on a predetermined region in the emission region of each sub-pixel; forming an electrode separator in a predetermined region on the buffer and a spacer in a predetermined region on the insulating layer; forming an organic electro luminescent layer in the emission region of each sub-pixel, the emission region including the insulating layer and the spacer; forming a second electrode on the second substrate where the organic electro luminescent layer is formed; and forming a seal pattern at edges of the first and second substrates, and encapsulating the first and second substrates.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or like parts.

Figure 1:
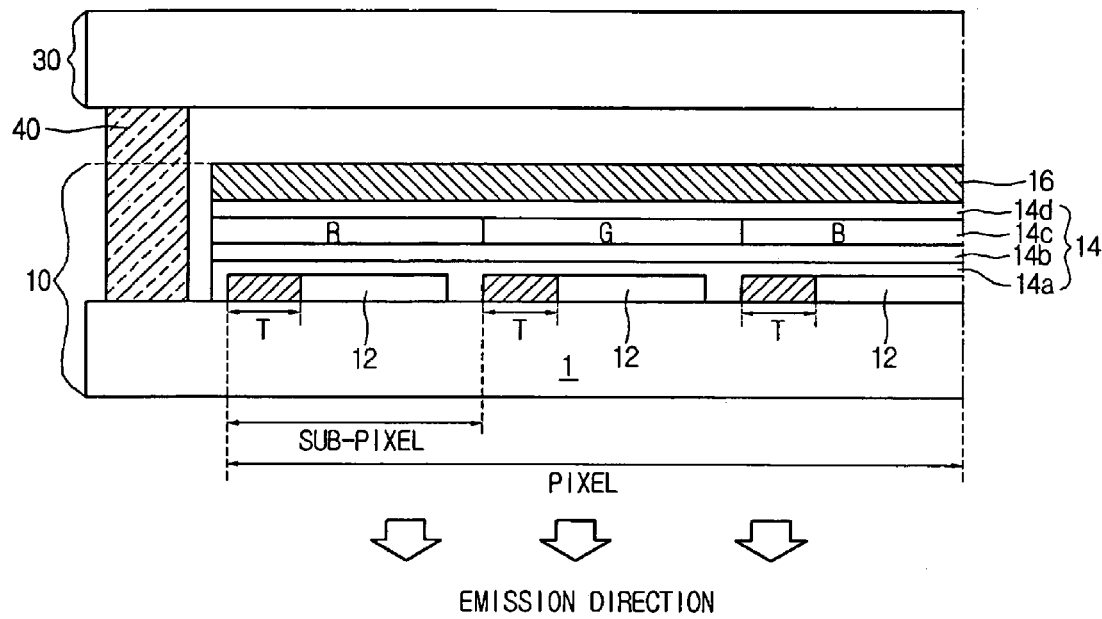
FIG. 1 is a schematic sectional view of a related art bottom emission type organic electro luminescence device.
Figure 2:
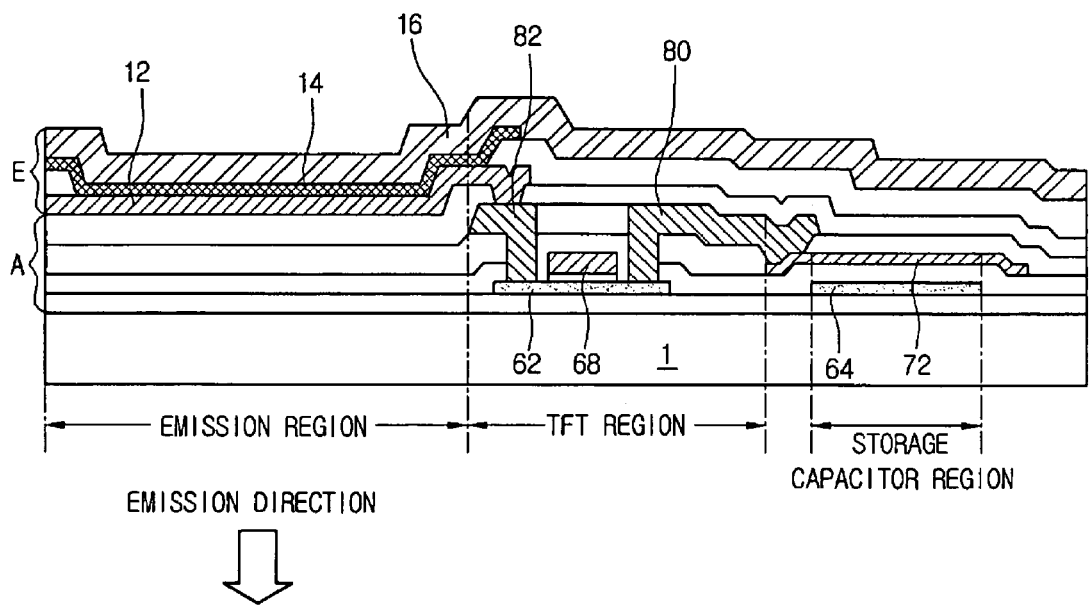
FIG. 2 is an enlarged sectional view of one sub-pixel region in the bottom emission type organic electro luminescence device shown in FIG. 1.
Figure 3:
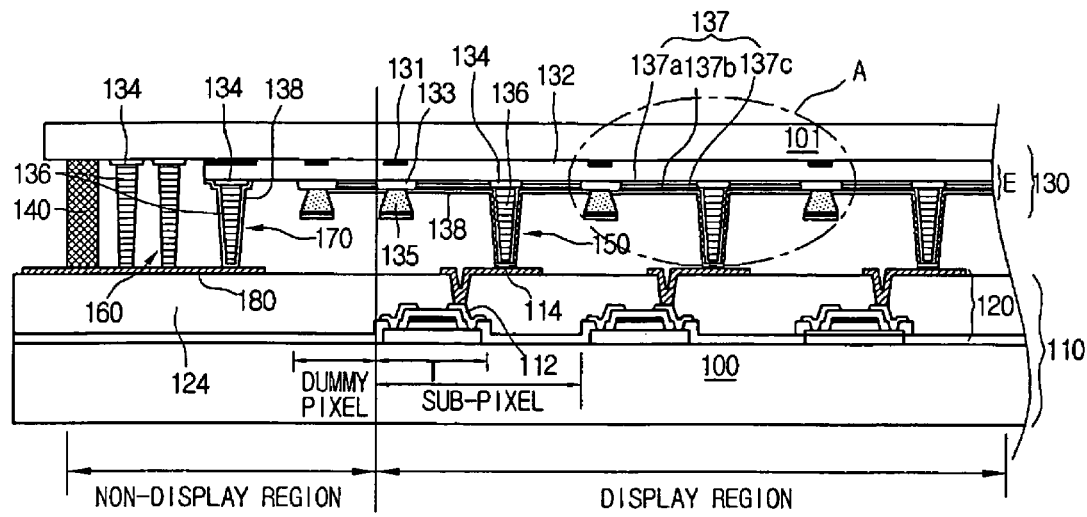
FIG. 3 is a schematic sectional view of a dual panel type organic electro luminescence device according to an embodiment of the present invention.

FIG. 3 is a schematic sectional view of a dual panel type organic electro luminescence device.

In FIG. 3, first and second substrates 110 and 130 are spaced apart from each other by a predetermined distance. An array element 120 is formed in an inner surface of a transparent substrate 100 of the first substrate 110 and an organic electro luminescent diode E is formed on an inner surface of a transparent substrate 101 of the second substrate 130. Edges of the first and second substrates 110 and 130 are encapsulated by a seal pattern 140.

The organic electro luminescence device includes a display region and a non-display region. In the display region, the array element and the organic electro luminescent diode are formed so that light is emitted. The non-display region is located outside of the display region.

In the display region, the organic electro luminescent diode E includes a first electrode 132 used as a common electrode, an electrode separator 135 disposed at a boundary of the sub-pixels on a top surface of the first electrode 132, an organic electro luminescent layer 137 disposed between electrode separators 135, and a second electrode 138 patterned for each sub-pixel.

A buffer 133 is formed to partition the organic electro luminescent layer 137, that is, to restrict the emission region.

The electrode separator 135 functions to partition the sub-pixels. As shown in FIG. 3, the electrode separator 135 is formed on the buffer 133 in a reversed tapered shape.

Also, in forming the buffer 133, an insulating layer 134 formed of a same material as the buffer 133 is further provided within the emission region. In forming the electrode separator 135 on the insulating layer 134, a spacer 136 is further formed of same material as the electrode separator 135. For example, the buffer 133 and the electrode separator 135 may be formed of an organic material or an inorganic material.

Unlike the electrode separator 135, the spacer 136 may be formed in a tapered shape so that the second electrode 138 may not be broken by the spacer 136. The spacer 136 is formed to be higher than the electrode separator 135.

That is, an outer surface of the spacer 135 is covered with the organic electro luminescent layer 137 and the second electrode 138 in sequence, which will be formed later. Accordingly, the spacer 136 becomes conductive so that it electrically connects the TFT T of each sub-pixel formed on the first substrate to the second electrode 138 formed on the second substrate in each sub-pixel.

The organic electro luminescent layer 137 includes a first carrier transporting layer 137a, an emission layer 137b, and a second carrier transporting layer 137c, which are stacked in sequence. The first and second carrier transporting layers 137a and 137c are used to inject electrons or holes into the emission layer 137b, or to transport them.

The first and second carrier transporting layers 137a and 137c are determined by arrangement of anode and cathode electrodes. For example, when the emission layer 137b is formed of high molecular compound and the first and second electrodes 132 and 138 are respectively configured as anode and cathode electrodes, the first carrier transporting layer 137a contacting with the first electrode 132 has a stacked structure of a hole injection layer and a hole transporting layer, and the second carrier transporting layer 137c contacting with the second electrode 138 has a stacked structure of an electron injection layer and an electron transporting layer.

Also, the organic electro luminescent layer 137 can be formed of a high molecular compound or a low molecular compound. When the organic electro luminescent layer 137 is formed of low molecular compound, it can be formed using a vapor deposition process. Meanwhile, when the organic electro luminescent layer 137 is formed of high molecular compound, it can be formed using an inkjet process.

An array element 120 includes TFTs. In order to supply a current to the organic electro luminescent diode E, conductive spacers 150 are disposed at positions where the second electrode 138 and the TFTs T are connected in each sub-pixel.

As described above, since the second electrode 138 covers the outer surface of the spacer 136 formed on the insulating layer 134 in the emission region of the second substrate, the spacers 150 become conductive. Unlike a spacer for a related art LCD, a main object of the conductive spacers 150 is to electrically connect the two substrates rather than to maintain a cell gap.

That is, the conductive spacer 150 electrically connects the drain electrode 112 of the TFT T provided on the first substrate in each sub-pixel and the second electrode 138 provided on the second substrate 130. The conductive spacer 150 is formed by coating a cylindrical spacer formed of an organic insulating layer with a metal. The conductive spacer 150 allows pixels of the first and second substrates 110 and 130 to be attached in a 1:1 relationship, such that a current can flow therethrough.

In this embodiment, the spacer 136 is formed in the emission region of the sub-pixel provided on the second substrate, and the outer surface of the spacer 136 is covered with a high molecular material or a low molecular material used in the organic electro luminescent layer 137 and material used in the second electrode 138. Therefore, the spacer 136 becomes conductive.

The connection portion of the conductive spacer 150 and the TFT T will now be described in more detail. A passivation layer 124 is formed at a region that covers the TFT T. The passivation layer 124 includes a drain contact hole 122 to expose a portion of the drain electrode 112. An electrical connection pattern 114 is formed on the passivation layer 124 such that it is connected to the drain electrode 112 through the drain contact hole.

Here, the TFT T corresponds to a drive TFT connected to the organic electro luminescent diode E.

The metal for the conductive spacer 150 is selected from conductive materials, for example, a metal having a ductility and a low specific resistance.

According to an embodiment of the present invention, the organic electro luminescence device is a top emission type that emits light from the organic electro luminescent layer 137 toward the second substrate 130.

The first electrode 132 is selected from conductive materials having a transmissive property, while the second electrode 138 is selected from opaque metal materials.

ITO may be used as transmissive material for the first electrode 132. Since the ITO has high resistance, an auxiliary electrode 131 is further formed below the first electrode so as to reduce the resistance of the first electrode.

The auxiliary electrode 131 can be formed of colored metal having a low specific resistance. As shown, the auxiliary electrode 131 is formed in a region corresponding to a region where the TFT is formed on the first substrate, that is, below a region where the buffer 133 is formed.

Also, the separated space I between the first substrate 110 and the second substrate 130 can be filled with an inert gas or an insulating liquid.

Although not shown in the drawing, the array element 120 further includes a scan line, a signal line and a power line crossing over the scan line and spaced apart from each other by a predetermined distance, a switching TFT disposed at an overlapped portion of the scan line and the signal line, and a storage capacitor.

The non-display region of the organic electro luminescence device will be described below. Referring to FIG. 3, the non-display region includes a plurality of dummy sub-pixels formed adjacent to an outermost sub-pixel of the display region, a common electrode connecting part 170 for receiving a common voltage from the first substrate and transmitting it to the first electrode as the common electrode formed on the second substrate, and a plurality of dummy spacers 160 formed in a region ranging from the common electrode connecting part 170 to the seal pattern 140.

In the dual panel type organic electro luminescence device, the array element and the organic electro luminescent diode are provided on different substrates. Therefore, unlike the case where the array element and the organic electro luminescent diode are formed on the same substrate, the organic electro luminescent diode is not influenced by the yield of the array element. Thus, the dual panel type organic electro luminescence device can have a good characteristic in terms of the production management of the respective elements.

If a screen is implemented in the top emission under the above-described conditions, the TFTs can be designed without considering aperture ratio, thereby increasing efficiency in array process. Also, products with high aperture ratio and high resolution can be produced. Since the organic electro luminescent diode is formed in a dual panel type, an outer air can be blocked more effectively compared with the related art top emission type, thereby enhancing stability of the product.

In addition, since the TFT and the organic electro luminescent diode are formed on different substrates, a degree of freedom with respect to the arrangement of the TFTs can be sufficiently obtained. Since the first electrode of the organic electro luminescent diode is formed on the transparent substrate, a degree of freedom with respect to the first electrode can be increased compared with the related art structure where the first electrode is formed on the array element.

Figure 4:
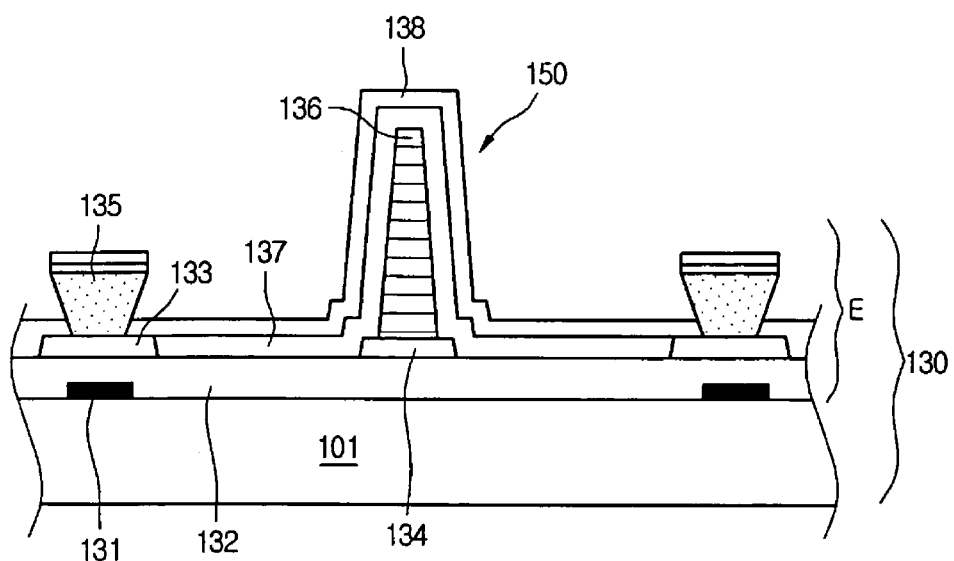
FIG. 4 is a sectional view of a specific region A in FIG. 3.

FIG. 4 is a sectional view of a specific region A in FIG. 3. In the dual panel type organic electro luminescence device of the present invention, one sub-pixel region formed in the display region of the second substrate is shown in FIG. 4.

Referring to FIG. 4, the first electrode 132 is formed on the transparent substrate 101 of the second substrate 130, and the buffer 133 and the electrode separator 135 are formed at a boundary of each sub-pixel on the first electrode 132.

The buffer 133 functions to partition the organic electro luminescent layer 137, that is, to restrict the emission region. The electrode separator 135 functions to partition the sub-pixels. As shown in FIG. 4, the electrode separator 135 is formed on the buffer 133 and has a reversed tapered shape.

That is, in each sub-pixel, a region between the buffers 133 is defined as the emission region and this region is formed of a high molecular material or a low molecular material of the organic electro luminescent layer.

In forming the buffer 133, an insulating layer 134 is further formed of a same material as the buffer 133. In forming the electrode separator 135 on the insulating layer 134, a spacer 136 is further formed of the same material as the electrode separator 135.

The buffer 133 and the electrode separator 135 may be formed of an organic material or an inorganic material. Unlike the electrode separator 135, the spacer 136 is formed to have a tapered shape so that the second electrode 138 may not be broken by the spacer 136. The spacer 136 is formed to be higher than the electrode separator 135.

That is, an outer surface of the spacer 136 is covered with the organic electro luminescent layer 137 and the second electrode 138 in sequence, which will be formed later. Accordingly, the spacer 136 becomes conductive so that it electrically connects the TFT T of each sub-pixel formed on the first substrate to the second electrode 138 formed on the second substrate in each sub-pixel.

Since the second electrode 138 covers the outer surface of the spacer 136 formed on the insulating layer 134 in the emission region of the second substrate, the spacers 150 become conductive. Unlike a spacer for a related art LCD, a main purpose of the conductive spacers 114 is to electrically connect the two substrates rather than to maintain a cell gap.

That is, the conductive spacer 150 electrically connects the drain electrode 112 of the TFT T provided on the first substrate in each sub-pixel and the second electrode 138 provided on the second substrate 130. The conductive spacer 150 is formed by coating a cylindrical spacer formed of an organic insulating layer with a metal. The conductive spacer 150 allows pixels of the first and second substrates 110 and 130 to be attached in 1:1 correspondence, such that a current can flow therethrough.

In this embodiment, the spacer 136 is formed in the emission region of the sub-pixel provided on the second substrate, and the outer surface of the spacer 136 is covered with high molecular material or low molecular material used in the organic electro luminescent layer 137 and material used in the second electrode 138. Therefore, the spacer 136 becomes conductive.

The organic electro luminescent layer 137 includes a first carrier transporting layer 137a, an emission layer 137b, and a second carrier transporting layer 137c, which are stacked in sequence. The first and second carrier transporting layers 137a and 137c are used to inject electrons or holes into the emission layer 137b, or to transport them.

Also, the organic electro luminescent layer 137 can be formed of high molecular compound or low molecular compound. When the organic electro luminescent layer 137 is formed of low molecular compound, it can be formed using a vapor deposition process. Meanwhile, when the organic electro luminescent layer 137 is formed of high molecular compound, it can be formed using an inkjet process.

Also, the second electrode 138 formed on the organic electro luminescent layer 137 is formed to cover the outermost surface of the conductive spacer 150. The second electrode 138 is formed of conductive material, for example, a metal material having a ductility and a low specific resistance.

Since the light from the organic electro luminescent layer 137 is emitted upward, the first electrode 132 is formed of one selected from conductive materials having a transmissive property, while the second electrode 138 is formed of one selected from opaque metal materials.

ITO may be used as transmissive material for the first electrode 132. Since the ITO has high resistance, an auxiliary electrode 131 is further formed below the first electrode so as to reduce the resistance of the first electrode.

The auxiliary electrode 131 can be formed of colored metal having a low specific resistance. As shown, the auxiliary electrode 131 is formed in a region corresponding to a region where the TFT is formed on the first substrate, that is, below a region where the buffer 133 is formed.

Figure 5:
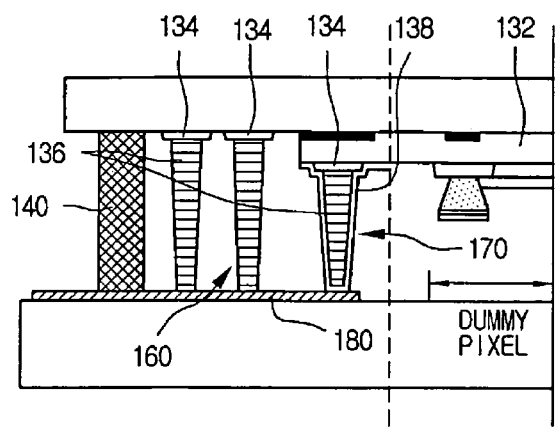
FIG. 5 is a sectional view of an outer region in the organic electro luminescence device shown in FIG. 3.

FIG. 5 is a sectional view of the outer region in the organic electro luminescence device shown in FIG. 3.

Referring to FIG. 5, the non-display region includes a plurality of dummy sub-pixels formed adjacent to the outermost sub-pixel of the display region, a common electrode connecting part 170 for receiving a common voltage from the first substrate and transmitting it to the first electrode as the common electrode formed on the second substrate, and a plurality of dummy spacers 160 formed in a region ranging from the common electrode connecting part 170 to the seal pattern 140.

Unlike the sub-pixel formed in the display region of the second substrate, the dummy sub-pixels do not have an insulating layer and a spacer in the emission region, and a TFT is not formed in a corresponding region of the first substrate. Thus, the dummy sub-pixels cannot receive a predetermined signal.

In the common electrode connecting part 170, the insulating layer 134 and the spacer 136 formed at end portion of the first electrode 132 are covered with a same metal as the second electrode 138. Therefore, the common electrode connecting part 170 is electrically connected to the electrode pad 180 formed on one side of the first substrate.

The first electrode 132 serves as a common electrode and a voltage must always be applied to the first electrode 132. As shown in FIG. 5, the common voltage is applied through the electrode pad 180 to the first electrode 132.

That is, the voltage applied from the electrode pad 180 is applied to the first electrode 132 through the common electrode connecting part 170 formed at the end portion of the first electrode 132.

Also, regarding the display region, the conductive spacer (150 in FIG. 4) is formed separately in each sub-pixel and functions to form a constant gap. A glass fiber is provided inside the seal pattern 140 formed at the edges of the two substrates, so that a predetermined gap is maintained. However, in the large-sized organic electro luminescence device, it is difficult to constantly maintain the gap between the first and second substrates.

In order to solve this problem, a plurality of dummy spacers 160 are provided in a region ranging from the common electrode connecting part 170 to the seal pattern 140. Using this structure, the gap between the first and second substrates can be maintained almost similar to the inside of the display region.

That is, in the large-sized organic electro luminescence device, the display failure occurring in the related art can be prevented.

At this time, in forming the insulating layer and the spacer in the display region, the dummy spacer 160 is formed on a predetermined portion of the second substrate, where the first electrode is not formed.

FIGS. 6A to 6F are sectional views illustrating a fabrication method of an organic electro luminescence device according to an embodiment of the present invention, focusing on the section view of FIG. 3.

Figure 6A:
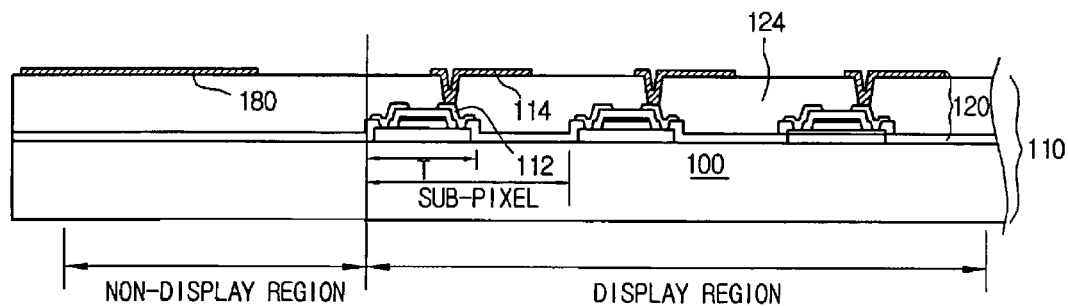
FIGS. 6A to 6F are sectional views illustrating a fabrication method of the organic electro luminescence device according to an embodiment of the present invention.

In FIG. 6A, the array element 120 is formed in the display region of the first substrate.

For example, when the TFT for the array element 120 is a polysilicon TFT, the method for forming the array element 120 includes: forming a buffer layer on the transparent substrate 100; forming a semiconductor layer and a capacitor electrode on the buffer layer; forming a gate electrode, and source and drain electrodes on the semiconductor layer; and forming a power electrode on the capacitor electrode, the power electrode being connected to the source electrode.

Then, the electrical connection pattern 114 is formed to be electrically connected to the drain electrode 112 of the drive TFT of the array element 120.

The connection portion of the electrical connection pattern 114 and the drive TFT T will now be described in more detail. The passivation layer 124 is formed at a region that covers the TFT T. The passivation layer 124 has the drain contact hole to expose a portion of the drain electrode 112. The electrical connection pattern 114 is formed on the passivation layer 124 such that it is connected to the drain electrode 112 through the drain contact hole. The electrical connection pattern 114 comes in contact with the conductive spacer, which will be formed on the second substrate. Consequently, it functions to electrically connect the first substrate and the second substrate.

The electrical connection pattern 114 and the drain electrode 112 can be formed in one body.

Also, in forming the electrical connection pattern 114, the electrical pad 180 is formed of same metal as the electrical connection pattern 114.

Figure 6B:
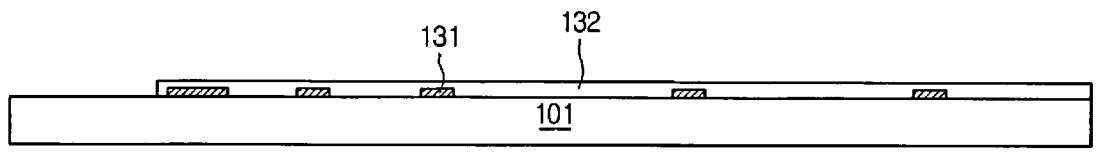

In FIG. 6B, the first electrode 132 of the organic electro luminescent diode is formed on the transparent substrate 101 of the second substrate.

The first electrode 132 may be formed of a transparent conductive material such as indium tin oxide (ITO).

Since the ITO has high resistance, an auxiliary electrode 131 is further formed below the first electrode so as to reduce the resistance of the first electrode.

The auxiliary electrode 131 can be formed of colored metal having a low specific resistance. As shown, the auxiliary electrode 131 is formed in a region corresponding to a region where the TFT is formed on the first substrate, that is, below a region where the buffer 133 is formed.

Figure 6C:
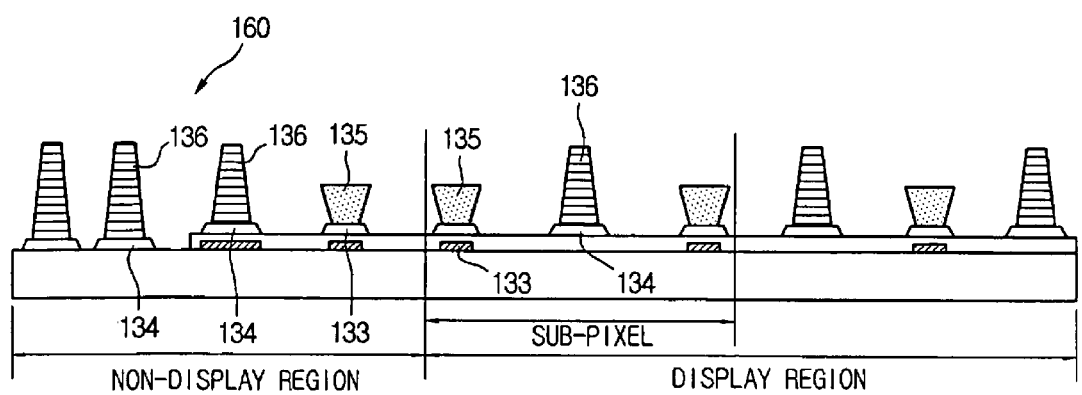

In FIG. 6C, in the display region, the buffer 133 for partitioning the sub-pixels is formed at a predetermined region on the first electrode, that is, an outer region of the sub-pixel. The electrode separator 135 is formed on the region where the buffer 133 is formed. The insulating layer 134 is formed of a same material as the buffer 133. The spacer 136 is formed of the same material as the electrode separator 136.

The buffer 133 functions to partition the organic electro luminescent layer formed inside the sub-pixel, that is, to restrict the emission region, and the electrode separator 135 functions to separate the adjacent sub-pixels. As shown in FIG. 6C, the electrode separator 135 is formed to have a reversed tapered shape.

On the contrary, the spacer 136 is formed to have a in a tapered shape so that the second electrode may not be broken by the spacer 136. The spacer 136 is formed to be higher than the electrode separator 135.

Also, in the non-display region, the insulating layer 134 and the spacer 136 forming the common electrode connecting part are formed at the end portion of the first electrode 132. The insulating layer 134 and the spacer 136 are also formed in a region of the second substrate, where the first electrode is not formed. In this manner, the dummy spacer 160 is formed.

Figure 6D:
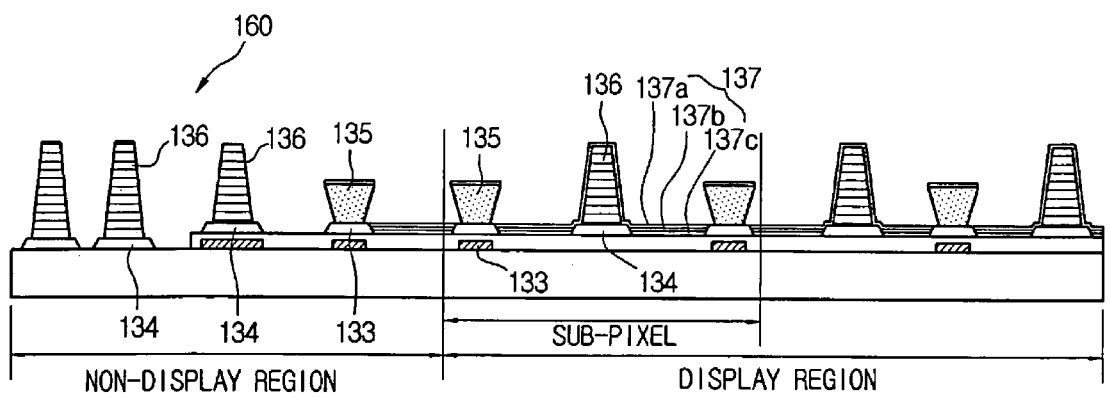

In FIG. 6D, the organic electro luminescent layer 137 is formed in a region defined by the buffer 133 in each sub-pixel.

The organic electro luminescent layer 137 is formed of high molecular material or low molecular material. When the first and second electrodes are the anode and the cathode, respectively, the organic electro luminescent layer 137 includes the hole transporting layer 137*a*, the emission layer 137*b*, and the electron transporting layer 137*c*, which are stacked in sequence. The hole/electron transporting layers 137*a* and 137*c* are used to inject holes or electrons into the emission layer 137*b*, and to transport them.

The hole transporting layer 137*a* contacting with the first electrode 132 has a stacked structure of a hole injection layer and a hole transporting layer, and the electron transporting layer 137*c* contacting with the second electrode 138 has a stacked structure of an electron injection layer and an electron transporting layer.

Figure 6E:
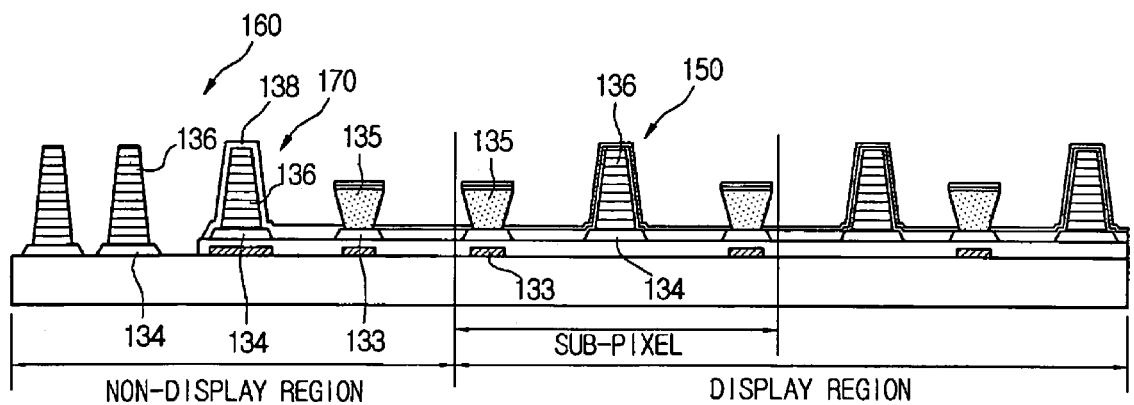

In FIG. 6E, after the organic electro luminescent layer 137 is formed between the buffers 133, the second electrode 138 of the organic electro luminescent diode is formed on the organic electro luminescent layer 137.

Since the second electrode 138 is divided according to the sub-pixel, it serves as the pixel electrode.

In this manner, the organic electro luminescent layer 137 and the second electrode 138 are formed to cover the outer surface of the spacer 136 provided in the emission region.

Consequently, since the spacer 136 becomes conductive, the TFT formed on the first substrate and the second electrode formed on the second substrate are electrically connected by the spacer 136.

The conductive spacer 150 is formed to cover the second electrode 138 in the outer surface of the spacer 136 formed on the insulating layer 134 of the emission region. Unlike the spacer for the related art LCD, the conductive spacer 150 electrically connects the two substrates rather than to maintain a cell gap.

That is, the conductive spacer 150 electrically connects the drain electrode 112 of the TFT T provided on the first substrate in each sub-pixel and the second electrode 138 provided on the second substrate 130. The conductive spacer 150 is formed by coating a cylindrical spacer formed of a same organic insulating layer as the electrode separator with a metal, that is, the second electrode. The conductive spacer 150 allows pixels of the first and second substrates 110 and 130 to be attached in 1:1 relationship, such that a current can flow therethrough.

Also, the second electrode 138 is formed to cover the insulating layer 134 and the spacer 136 formed at the end portion of the first electrode in the non-display region. The second electrode 138 comes in contact with the electrode pad 180, thereby forming the common electrode connecting part 170.

Figure 6F:
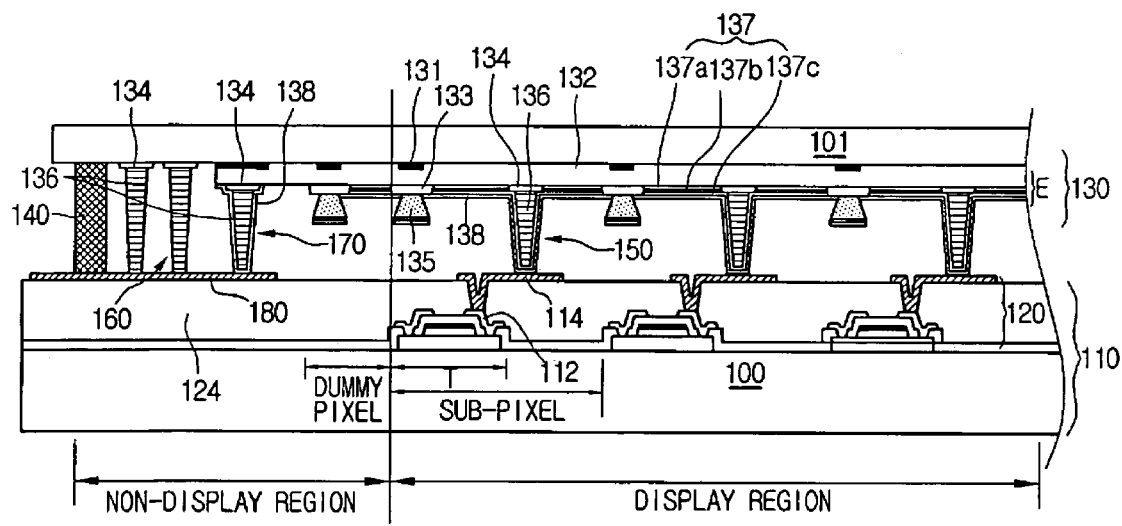

In FIG. 6F, the first and second substrates 110 and 130 are attached to each other and encapsulated. Due to the attachment of the electrical connection pattern 114 of the first substrate 110 and the conductive spacer 150 of the second substrate 130, the first and second substrates 110 and 130 are electrically connected to each other. Consequently, the second electrode 138 of the organic electro luminescent diode formed on the second substrate 130 is electrically connected to the drain electrode 112 of the drive TFT formed on the first substrate 110.

According to the present invention, production yield and production management efficiency can be enhanced. Since the organic electro luminescence device is a top emission type, the design of the TFTs becomes easy and high aperture ratio and high resolution can be provided. Also, since the electrode for the organic electro luminescence diode is formed on the substrate, various materials can be used. In addition, since the organic electro luminescence device is a top emission type and has an encapsulation structure, reliable products can be provided.

Further, the gap between the first and second substrates can be maintained almost similar to the inside of the array region by forming dummy spacers in the region ranging from the outside of the array region to the seal pattern.

It will be apparent to those skilled in the art that various modifications and variations can be made in the present invention. Thus, it is intended that the present invention cover the modifications and variations of this invention provided they come within the scope of the appended claims and their equivalents.

What is claimed is:

1. An organic electro luminescence device, comprising:
a display region and a non-display region in first and second substrates, wherein the display region includes sub-pixels;
an array element including at least one TFT in the display region of the first substrate in each sub-pixel;
a first electrode in an inner surface of the second substrate;
a buffer in a predetermined region to partition an emission region of each sub-pixel on the first electrode, and an electrode separator on the buffer;
an insulating layer in the emission region of each sub-pixel, and a spacer on the insulating layer;
an organic electro luminescent layer in the emission region of each sub-pixel, the emission region including the insulating layer and the spacer; and
a second electrode on organic electro luminescent layer;
wherein the spacer is covered by the organic electro luminescent layer and the second electrode;
wherein the second electrode over the spacer is electrically connected with the array element,
wherein the second electrode includes a protruding part corresponding to the spacer and contacting with the array element,
wherein the spacer is higher than the electrode separator,
wherein the non-display region includes:
a plurality of dummy sub-pixels adjacent to outermost sub-pixels of the display region;
a common electrode connecting part for receiving a common voltage from the first substrate and transmitting the common voltage to the first electrode, wherein the first electrode serving as a common electrode formed on the second substrate;
a seal pattern at edges of the substrates to encapsulate the first and second substrates; and
a plurality of dummy spacers at a region ranging from the common electrode connecting part to the seal pattern,
wherein the spacer over the second substrate has a tapered shape to prevent the second electrode from being broken by the spacer in the formation of the second electrode.

2. The organic electro luminescence device according to claim 1, wherein the electrode separator separates adjacent sub-pixels and has a reversed tapered shape.

3. The organic electro luminescence device according to claim 1, wherein the insulating layer is formed of a same material as the buffer, and the spacer formed on the insulating layer is a same material as the electrode separator.

4. The organic electro luminescence device according to claim 1, wherein the conductive spacer electrically connects the TFT of each sub-pixel formed on the first substrate with the second electrode formed on the second substrate in each sub-pixel.

5. The organic electro luminescence device according to claim 1, further comprising an auxiliary electrode below the first electrode to reduce a resistance of the first electrode.

6. The organic electro luminescence device according to claim 5, wherein the auxiliary electrode is a colored metal having a low specific resistance, the auxiliary electrode being formed below a region, and wherein the buffer is on the second substrate, corresponding to a region where the TFT is formed on the first substrate.

7. The organic electro luminescence device according to claim 1, wherein the common electrode connecting part is formed by covering the insulating layer and the spacer with a same metal material as the second electrode, the insulating layer and the spacer being formed on an end portion of the first electrode formed on the second substrate.

8. The organic electro luminescence device according to claim 7, wherein the common electrode connecting part is electrically connected to an electrode pad at one surface of the first substrate, and receives a common voltage from the electrode pad.

* * * * *